United States Patent
Hsu et al.

(10) Patent No.: US 7,768,131 B1
(45) Date of Patent: Aug. 3, 2010

(54) PACKAGE STRUCTURE PREVENTING SOLDER OVERFLOW ON SUBSTRATE SOLDER PADS

(75) Inventors: Jun-Chung Hsu, Taoyuan (TW); Chen-Lin Li, Hsinchu (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 12/493,171

(22) Filed: Jun. 27, 2009

(51) Int. Cl.
*H01L 23/48* (2006.01)

(52) U.S. Cl. ............... 257/773; 257/779; 257/E23.023

(58) Field of Classification Search .............. None
See application file for complete search history.

(56) References Cited

U.S. PATENT DOCUMENTS

| | | | | |
|---|---|---|---|---|
| 4,605,153 A | * | 8/1986 | Van Den Brekel et al. | 228/56.3 |
| 4,739,917 A | * | 4/1988 | Baker | 228/123.1 |
| 4,940,181 A | * | 7/1990 | Juskey et al. | 228/180.21 |
| 5,172,852 A | * | 12/1992 | Bernardoni et al. | 228/180.21 |
| 5,426,266 A | * | 6/1995 | Brown et al. | 174/267 |
| 6,750,546 B1 | * | 6/2004 | Villanueva et al. | 257/778 |
| 7,081,372 B2 | * | 7/2006 | Lo | 438/106 |
| 7,164,202 B2 | * | 1/2007 | Wang et al. | 257/737 |
| 7,221,045 B2 | * | 5/2007 | Park et al. | 257/676 |
| 7,250,685 B2 | * | 7/2007 | Shim et al. | 257/778 |
| 7,276,740 B2 | * | 10/2007 | Kim et al. | 257/99 |
| 7,317,249 B2 | * | 1/2008 | Crisp et al. | 257/723 |
| 7,361,531 B2 | * | 4/2008 | Sharma et al. | 438/111 |
| 7,473,580 B2 | * | 1/2009 | Farooq et al. | 438/108 |
| 2003/0141103 A1 | * | 7/2003 | Ng et al. | 174/250 |
| 2006/0067062 A1 | * | 3/2006 | Ishimoto et al. | 361/753 |

* cited by examiner

*Primary Examiner*—Scott B Geyer

(57) ABSTRACT

A package structure preventing solder overflow on substrate solder pads includes a plurality of die pins, a plurality of solders and a plurality of substrate solder pads. The die pins are located under a die. The substrate solder pads are formed on an upper surface of a substrate by copper plating or etching. Each of the substrate solder pads has at least one solder pad connection point. The solders connect the die pins with the corresponding solder pad connection points, respectively. Each of the solder pad connection points has a pair of solder pad ridges or a pair of solder pad grooves. The solder pad ridges and the solder pad grooves filled with the solder or a resin can prevent the solder overflow problem.

12 Claims, 6 Drawing Sheets

PACKAGE STRUCTURE PREVENTING SOLDER OVERFLOW ON SUBSTRATE SOLDER PADS

BACKGROUND OF THE INVENTION

1. Field of the Invention

The present invention relates to a package structure preventing solder overflow on substrate solder pads, especially to a package structure using solder pad ridges or solder pad grooves to reduce solder overflow.

2. The Prior Art

The growing requirement for smaller electronic products has augmented the demand for flip-chip technology in system-in-package (SIP). However, the package process has faced a new problem, which is the occurrence of solder spread on a big solder pad. It makes the solder unable to bridge the solder joints after reflow, so that it affects the reliability of the package.

Referring to FIG. 1, a conventional flip chip package structure 1 includes a plurality of die pins 15, a plurality of solders 40, and a plurality of substrate solder pads 30. The die pins 15 are included in a die 10 and the die pins 15 are located under the die 10. The substrate solder pads 30 are included in a substrate 20. The substrate solder pads 30 are formed on an upper surface of the substrate 20 by copper plating or etching. The solders 40 connect the die pins 15 with the corresponding substrate solder pads 30.

When applying the flip chip process of prior art to SIP, some of the substrate solder pads 30 needs to have large areas to meet the requirements of grounding and having multiple joints at the same time. Therefore, it makes the solder 40 overflow easily on the larger substrate solder pad 30 when packaging, as shown in region A of FIG. 1. Because of overflow, the solder 40 can not connect the die pin 15 with the substrate solder pad 30. Thus, the die pin 15 disconnects from the substrate solder pad 30. It causes a serious problem of reliability of the package.

Right now, it usually uses solder mask dams to prevent the overflow of the solder 40 without affecting electric properties. However, for a flip chip design, the solder mask dams on the die pad are likely too thick, which makes the distance between the die 10 and the substrate 20 too small. It would directly influence the yield of molding or underfilling. If the thickness of the solder mask dams is decreased, the solder mask peeling is likely to happen. The reliability is affected.

SUMMARY OF THE INVENTION

A primary objective of the present invention is to provide a package structure which prevents solder on substrate solder pads from overflow. The package structure according to the present invention includes a plurality of die pins, a plurality of solders and a plurality of solder pads. The die pins are located under the die. The substrate solder pads are formed on a substrate by copper plating or etching. Each of the substrate solder pads has at least one solder pad connection point. The solder connects the die pin with the corresponding solder pad connection point. Each of the solder pad connection points has a pair of solder pad ridges or a pair of solder pad grooves. The pair of solder pad ridges prevents the solder from overflowing when processing flip chip. The pair of solder pad grooves is filled with the solder to minimize the overflow of the solder due to the cohesion of the solder. Alternatively, applying a resin coating to cover the solder pad grooves may prevent the solder from overflowing. Because the material property of the resin is different from that of the solder, the solderability of the resin is low. In some packaging designs, instead of a pair of solder pad ridges or a pair of solder pad grooves, the solder pad connection point may have only one solder pad ridge or one solder pad groove.

Therefore, the present invention may overcome the aforementioned disadvantages of prior art. It may improve the yield of packaging by using the solder pad ridges with a height and a width or the solder pad grooves with a depth and a width filled with the solder or a resin to prevent solder from overflowing when processing flip chip.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Reference will now be made in detail to embodiments of the present invention, examples of which are illustrated in the accompanying drawings.

Figure 1:
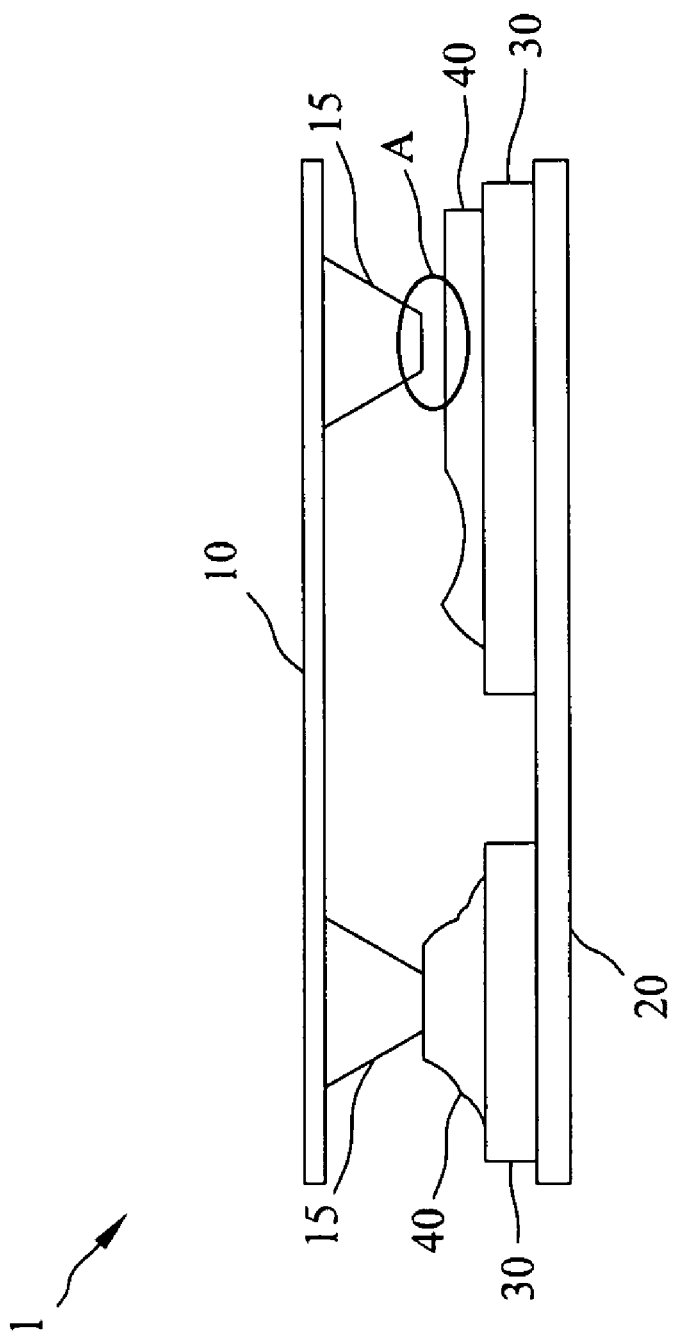
FIG. 1 is a view of a conventional flip chip package structure.
Figure 2:
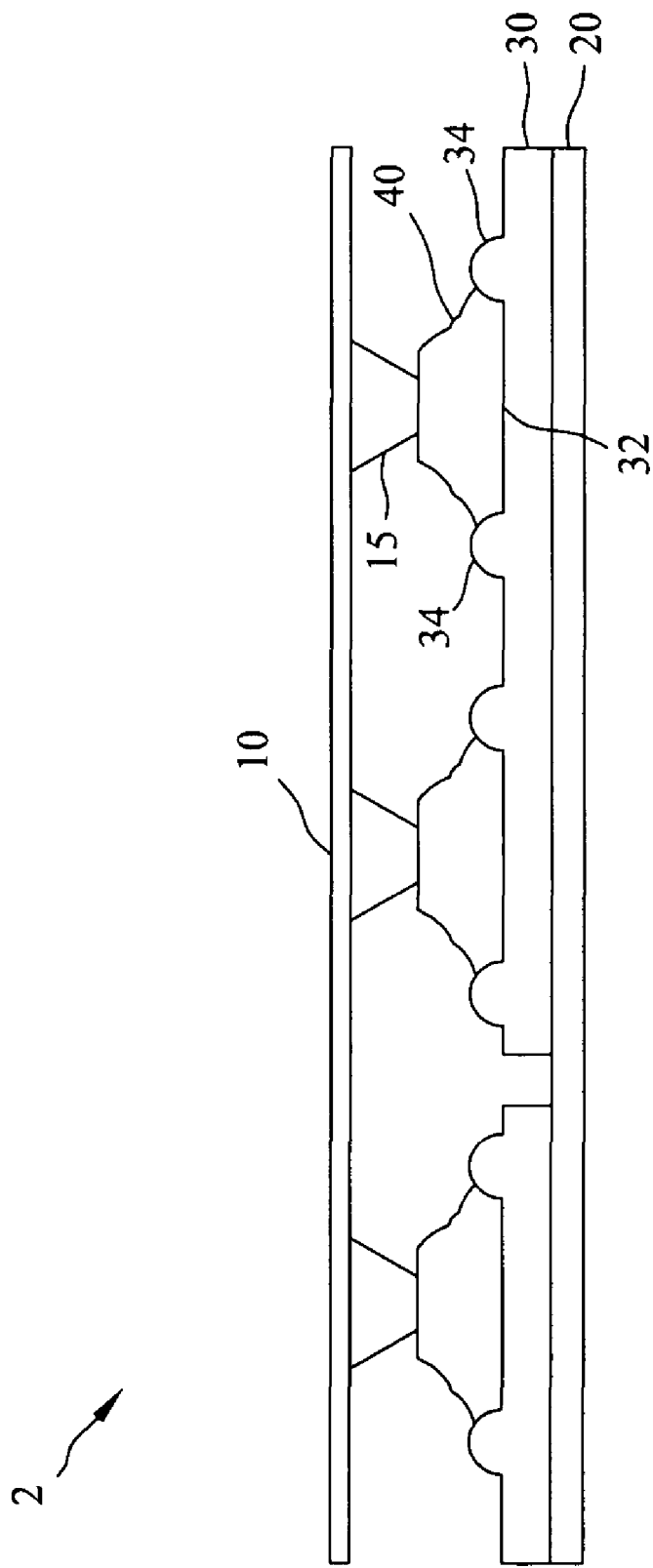
FIG. 2 is a view of a package structure preventing solder overflow on substrate solder pads according to a first embodiment of the present invention.
Figure 3:
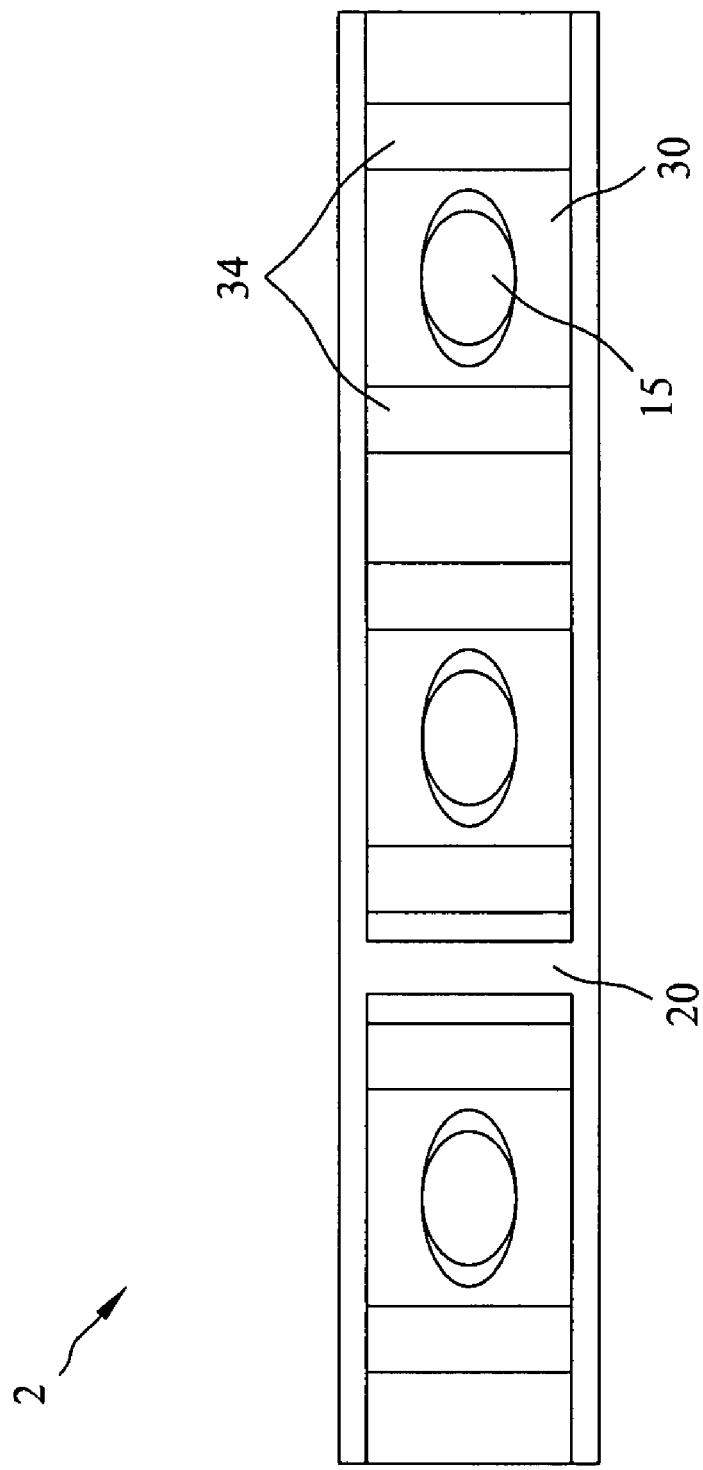
FIG. 3 is a top view of FIG. 2.

Referring to FIGS. 2 and 3, a package structure 2 preventing solder overflow on substrate solder pads according to a first embodiment of the present invention includes a plurality of die pins 15, a plurality of solders 40, and a plurality of substrate solder pads 30. The die pins 15 are connected with and located under a die 10. The substrate solder pads 30 are formed on an upper surface of a substrate 20 by copper plating or etching. Each of the substrate solder pad 30 has at least one solder pad connection point 32 corresponding to the die pin 15 of the die 10. For example, the left substrate solder pad 30 has only one solder pad connection point 32 and the right substrate solder pad 30 has two solder pad connection points 32, as shown in FIG. 2.

The solders 40 connect the die pins 15 with the corresponding solder pad connection points 32, respectively. Each of the solder pad connection points 32 has a pair of solder pad ridges 34 respectively disposed at both sides thereof, as shown in FIG. 3. The pair of the solder pad ridges 34 has a width and a height for blocking the solder 40 from overflowing when processing flip chip. The solder pad ridges 34 may be made of copper. Both of the width and the height of the solder pad ridges 34 can be controlled by copper plating or etching. In some packaging designs, instead of a pair of solder pad ridges 34, the solder pad connection point 32 may have only one solder pad ridge 34 disposed at a side thereof.

Figure 4:
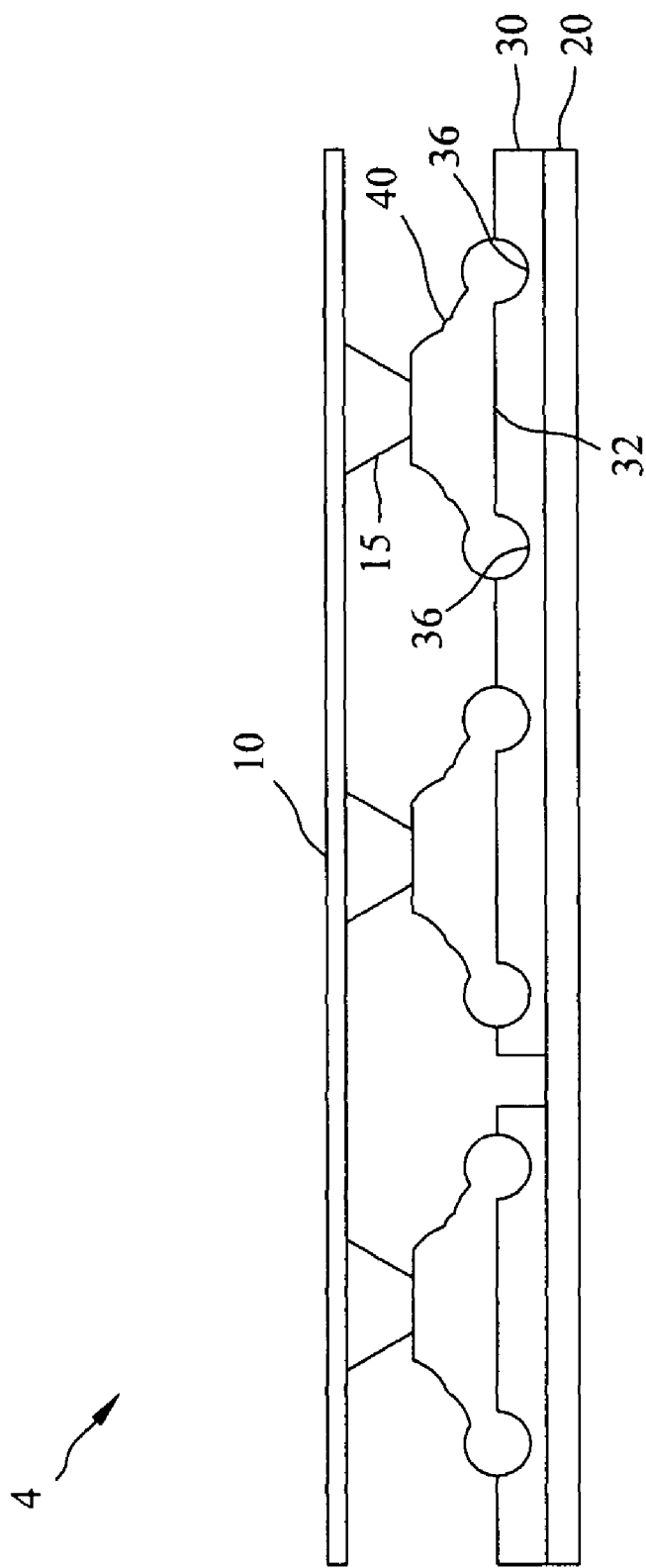
FIG. 4 is a view of a package structure preventing solder overflow on substrate solder pads according to a second embodiment of the present invention.
Figure 5:
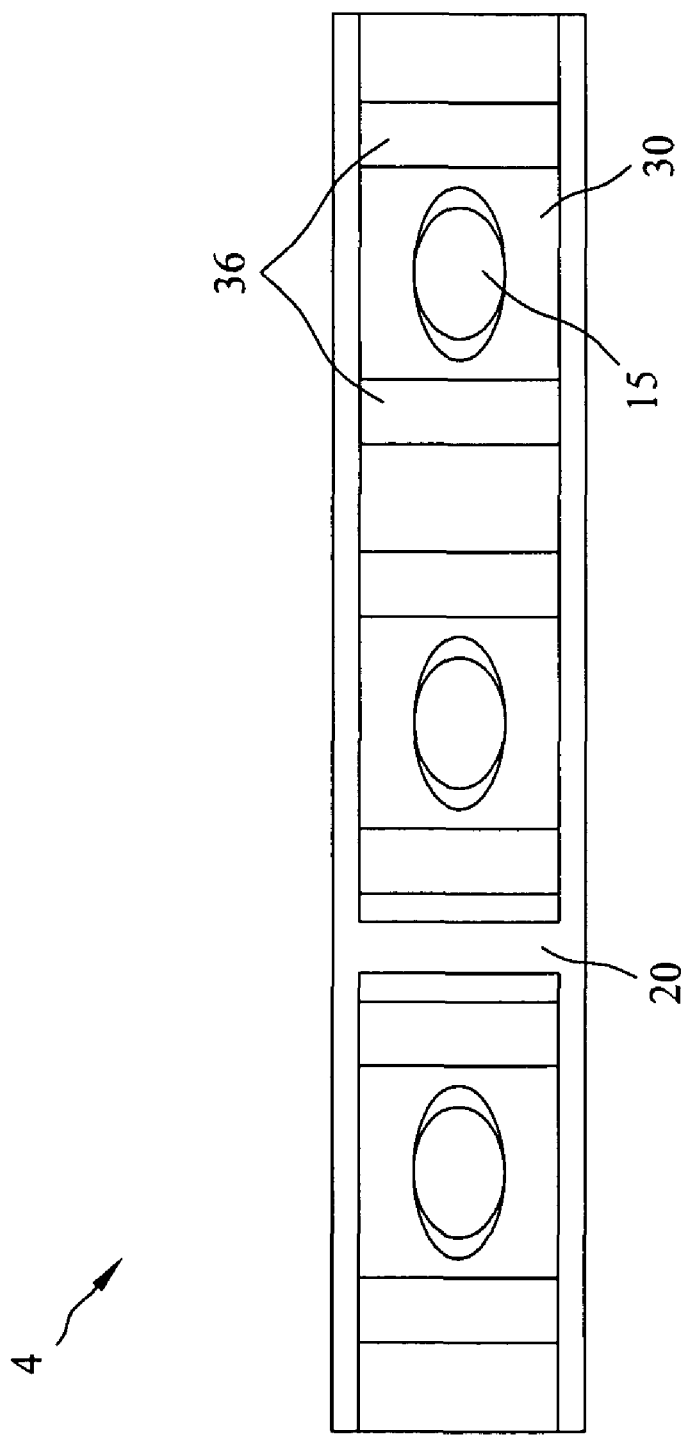
FIG. 5 is a top view of FIG. 4.

Referring to FIGS. 4 and 5, a package structure 4 preventing solder overflow on substrate solder pads according to a second embodiment of the present invention is similar to the package structure 2 according to the first embodiment shown in FIGS. 2 and 3. The difference between the first embodiment and the second embodiment is that the solder pad ridges 34 are replaced by solder pad grooves 36. The two solder pad grooves 36 are respectively located at both sides of each of the solder pad connection points 32, as shown in FIG. 5. The pair of the solder pad grooves 36 has a width and a depth and is filled with the solder 40. The overflow of the solder 40 is minimized due to the cohesion of the solder 40. A material of the solder pad grooves 36 may be copper. Both of the width and the depth of the solder pad grooves 36 may be controlled by copper plating or etching. In some packaging designs, instead of a pair of solder pad grooves 36, the solder pad connection point 32 may have only one solder pad groove 36 disposed at a side thereof.

Figure 6:
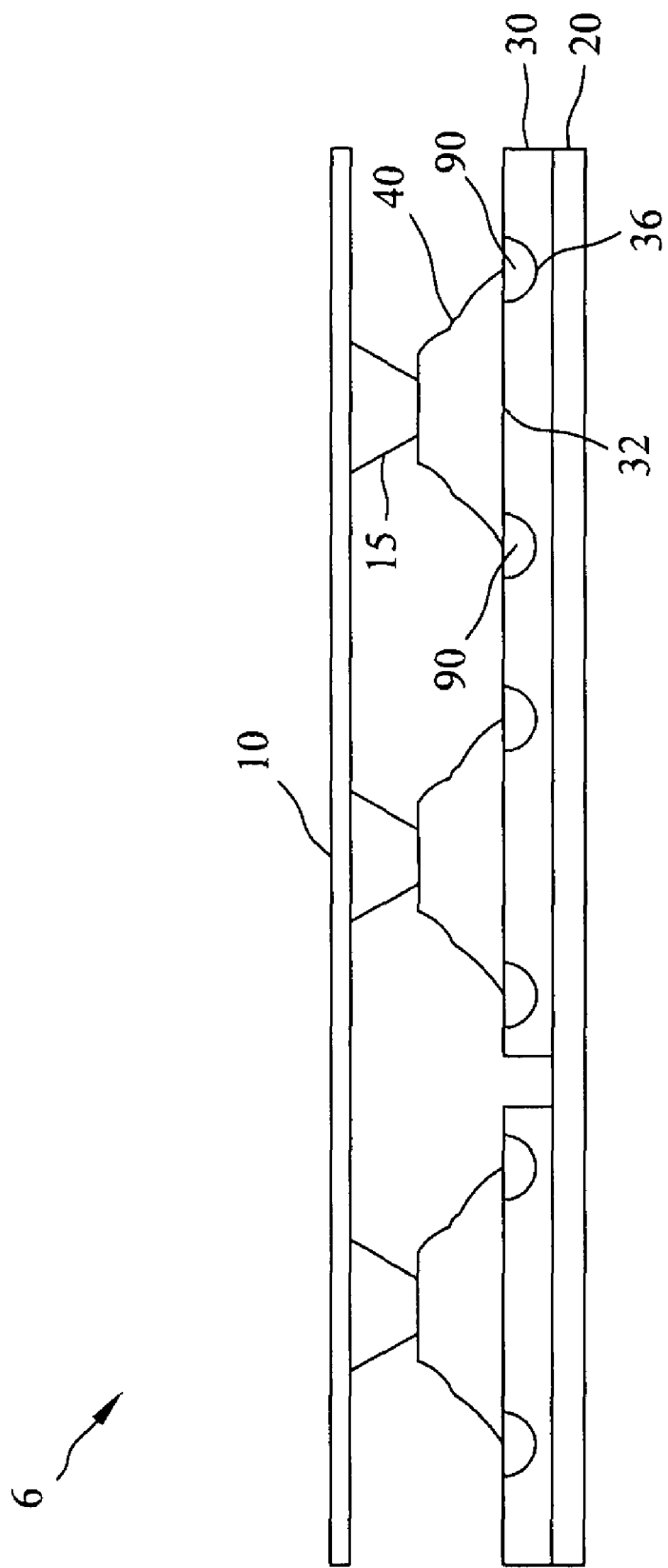
FIG. 6 is a view of a package structure preventing solder overflow on substrate solder pads according to a third embodiment of the present invention.

Referring to FIG. 6, a package structure 6 preventing solder overflow on substrate solder pads according to a third embodiment of the present invention is similar to the package structure 4 according to the second embodiment shown in FIGS. 4 and 5. The difference between the second embodiment and the third embodiment is that the solder pad grooves 36 of the third embodiment are coated and covered by a resin 90, but the solder pad grooves 36 of the second embodiment are filled with the solder 40. Since the material surface property of the resin 90 is different from that of the solder 40, the solder 40 is difficult to overflow onto the resin 90. Thus, it may prevent solder overflow. Similarly, in some packaging designs, the solder pad connection point 32 may have only one solder pad groove 36 disposed at a side thereof.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A package structure preventing solder overflow on substrate solder pads adaptive for packaging a die to a substrate and being capable of preventing overflow, the package structure comprising:
   a plurality of die pins connected with and disposed under the die;
   a plurality of substrate solder pads formed on an upper surface of the substrate, each of the substrate solder pads having at least one solder pad connection point corresponding to the die pin; and
   a plurality of solders connecting the die pins with the corresponding solder pad connection points, respectively;
   wherein each of the solder pad connection points has a solder pad ridge located at a side thereof.

2. The package structure as claimed in claim 1, wherein the solder pad connection point has a pair of solder pad ridges located at both sides thereof, respectively.

3. The package structure as claimed in claim 1, wherein the solder pad ridge has a width and a height.

4. The package structure as claimed in claim 1, wherein the solder pad ridge is made of copper.

5. A package structure preventing solder overflow on substrate solder pads adaptive for packaging a die to a substrate and being capable of preventing overflow, the package structure comprising:
   a plurality of die pins connected with and disposed under the die;
   a plurality of substrate solder pads formed on an upper surface of the substrate, each of the substrate solder pads having at least one solder pad connection point corresponding to the die pin; and
   a plurality of solders connecting the die pins with the corresponding solder pad connection points, respectively;
   wherein each of the solder pad connection points has a solder pad groove located at a side thereof.

6. The package structure as claimed in claim 5, wherein the solder pad connection point has a pair of solder pad grooves located at both sides thereof, respectively.

7. The package structure as claimed in claim 5, wherein the solder pad groove has a width and a depth.

8. The package structure as claimed in claim 5, wherein a material of the solder pad groove is copper.

9. A package structure preventing solder overflow on substrate solder pads adaptive for packaging a die to a substrate and being capable of preventing overflow, the package structure comprising:
   a plurality of die pins connected with and disposed under the die;
   a plurality of substrate solder pads formed on an upper surface of the substrate, each of the substrate solder pads having at least one solder pad connection point corresponding to the die pin; and
   a plurality of solders connecting the die pins with the corresponding solder pad connection points, respectively;
   wherein each of the solder pad connection points has a solder pad groove located at a side thereof and the solder pad groove is coated and covered by a resin.

10. The package structure as claimed in claim 9, wherein the solder pad connection point has a pair of solder pad grooves respectively located at both sides thereof and the solder pad grooves are coated and covered by the resin.

11. The package structure as claimed in claim 9, wherein the solder pad groove has a width and a depth.

12. The package structure as claimed in claim 9, wherein a material of the solder pad grooves is copper.

* * * * *